(12) United States Patent
Tamemasa et al.

(10) Patent No.: US 7,510,744 B2
(45) Date of Patent: Mar. 31, 2009

(54) PROCESS FOR PRODUCING A RESIN COMPOSITION AND ELECTROPHOTOGRAPHIC FIXING MEMBER

(75) Inventors: Hiroshi Tamemasa, Minamiashigara (JP); Makoto Omata, Minamiashigara (JP); Shigeo Ohta, Minamiashigara (JP); Takahiro Okayasu, Minamiashigara (JP)

(73) Assignee: Fuji Xerox Co., Ltd., Tokyo (JP)

( * ) Notice: Subject to any disclaimer, the term of this patent is extended or adjusted under 35 U.S.C. 154(b) by 450 days.

(21) Appl. No.: 11/121,115

(22) Filed: May 4, 2005

(65) Prior Publication Data
US 2005/0189628 A1 Sep. 1, 2005

Related U.S. Application Data

(62) Division of application No. 10/252,561, filed on Sep. 24, 2002, now Pat. No. 7,060,349.

(51) Int. Cl.
*B05D 7/02* (2006.01)
*B05D 7/04* (2006.01)
*B05D 3/10* (2006.01)
B32B 3/26 (2006.01)
G03G 15/20 (2006.01)

(52) U.S. Cl. .................. 427/404; 427/243; 427/340; 427/412.1; 427/437; 427/443.1

(58) Field of Classification Search ............. 427/243, 427/245, 337, 340, 407.1, 412.1, 437, 443.1, 427/404
See application file for complete search history.

(56) References Cited

U.S. PATENT DOCUMENTS

| 4,975,327 A | 12/1990 | Somasiri et al. |
| 5,236,572 A | 8/1993 | Lam et al. |
| 5,241,343 A | 8/1993 | Nishio |
| 5,345,300 A | 9/1994 | Uehara et al. |
| 5,510,195 A * | 4/1996 | Sano et al. .................. 428/613 |
| 5,527,569 A | 6/1996 | Hobson et al. |
| 5,798,154 A | 8/1998 | Bryan |
| 6,077,792 A * | 6/2000 | Farrar .......................... 438/780 |
| 6,391,932 B1 | 5/2002 | Gore et al. |
| 6,488,632 B2 | 12/2002 | Ohara et al. |
| 6,720,084 B2 * | 4/2004 | Maeyama et al. ........... 428/458 |

FOREIGN PATENT DOCUMENTS

| JP | A 57-74131 | 5/1982 |
| JP | A 62-19437 | 1/1987 |
| JP | A-03-082750 | 4/1991 |
| JP | A 3-180309 | 8/1991 |
| JP | A 4-186891 | 7/1992 |
| JP | 05-150674 | 6/1993 |
| JP | A 5-299820 | 11/1993 |
| JP | A 6-23770 | 2/1994 |
| JP | A 6-256960 | 9/1994 |
| JP | A 6-316768 | 11/1994 |
| JP | A 7-2070 | 1/1995 |
| JP | A 7-216225 | 8/1995 |
| JP | A-09-080939 | 3/1997 |
| JP | A 9-85756 | 3/1997 |
| JP | 2000-319442 | * 11/2000 |
| JP | 2000-319442 A | * 11/2000 |
| JP | A 2002-91027 | 3/2002 |
| JP | 2002-210846 | 7/2002 |

* cited by examiner

*Primary Examiner*—William Phillip Fletcher, III
(74) *Attorney, Agent, or Firm*—Oliff & Berridge, PLC

(57) ABSTRACT

A process for producing a resin composition having a high adhesion between a resin layer and a metallic layer as well as an excellent durability includes providing a porous structure at least on the surface of the resin layer; and forming the metallic layer on the surface of the resin layer.

12 Claims, 1 Drawing Sheet

PROCESS FOR PRODUCING A RESIN COMPOSITION AND ELECTROPHOTOGRAPHIC FIXING MEMBER

RELATED U.S. APPLICATION DATA

This is a Division of application Ser. No. 10/252,561 filed Sep. 24, 2002, now U.S. Pat. No. 7,060,349. The entire disclosure of the prior application is hereby incorporated by reference herein in its entirety.

FIELD OF THE INVENTION

The present invention relates to a resin composition, a process for producing the same, and an electrophotographic fixing member. More specifically, it relates to a resin composition which has a metallic layer on a surface of a heat-resistant resin layer and which can advantageously be used in a printed circuit substrate and an electrophotographic member such as a fixing member, a process for producing the same, and an electrophotographic fixing member.

DESCRIPTION OF THE RELATED ART

A laminate in which a thin film of a conductive metal such as copper or aluminum is laminated on a thin plate made of a heat-resistant resin or a thin plate in which a core member is impregnated with a heat-resistant resin has so far found wide acceptance as a printed circuit substrate. Further, in an image forming apparatus of an electrophotographic system or an electrostatic recording system using a dry toner as well, a film in which a heat-resistant resin is laminated with a metallic thin film is sometimes used, in the form of an endless belt, as a fixing belt by which to fix a toner image with heat and pressure. In this fixing belt, an unfixed toner image formed by an electrophotographic process is fixed under pressure by electromagnetic induction heating.

As the fixing belt, for example, an endless belt obtained by laminating a film member made of a heat-resistant resin such as a thermosetting polyimide, an aromatic polyimide (aramid) or a liquid crystal polymer and having a thickness of from 50 to 200 μm with a copper thin film having a thickness of from 1 to 50 μm and forming thereon, as required, a heat-resistant elastic layer and further a heat-resistant release layer is used. The liquid crystal polymer is a polymer showing a liquid crystal property in a solution state or in a molten state. A thermotropic liquid crystal polymer showing a liquid crystal property in a molten state has excellent properties such as a high strength, a high heat resistance, a low coefficient of linear expansion, a high insulation, a low moisture absorption and a high gas barrier property in particular. Accordingly, it has been increasingly used not only in products utilizing a liquid crystal property but also in mechanical parts and fibers.

In the production of the film member in which the heat-resistant resin layer is laminated with the metallic thin film, a method in which a heat-resistant resin film and a metallic foil are adhered with an adhesive and a method in which a metallic thin film is formed on a heat-resistant resin film by chemical plating or physical plating have been known.

However, in the method in which the adhesion is conducted with the adhesive as noted above, an adhesion strength is less reliable when the metallic thin film is repeatedly subjected to electromagnetic induction heating. Also in the method in which the metallic thin film is formed on the heat-resistant resin, it is generally difficult to firmly adhere a heat-resistant resin such as a polyimide or an aromatic polyamide (aramid) to a metallic thin film of copper. Accordingly, a technique for improving an adhesion has been disclosed. For example, JP-A-5-299820 proposes a technique in which a deposited metallic film is formed on a polyimide and an electron beam heat-deposited copper layer and an electroplated copper layer are then laminated in this order.

JP-A-6-316768 discloses a technique in which for incorporating fluorine in a polyimide to make this fluorine an adhesion site, first etching is conducted with a hydrazine-containing aqueous solution and then second etching is conducted with naphthalene-1-sodium to expedite adhesion of copper. JP-A-7-216225 discloses a technique in which a polyimide precursor is mixed with a metallic powder to increase an adhesion with a metallic film through plating.

Meanwhile, when a heat-resistant resin is an aromatic polyamide (aramid), JP-A-6-256960 proposes a technique in which etching is conducted with an aqueous solution containing hydrazine and an alkali metal hydroxide and catalyst imparting treatment is then conducted for electroless plating.

However, according to a method in which a heat-resistant resin is molded and a metallic thin film is then formed thereon as in the ordinary techniques, no satisfactory adhesion is obtained or a production process is hardly rationalized. On the other hand, when a liquid crystal polymer is used as a heat-resistant resin, a film member can directly be hot-pressed with a metallic foil. However, the film member of the liquid crystal polymer is generally oriented drastically in the molding and tends to be torn unidirectionally.

SUMMARY OF THE INVENTION

The invention has been made under these circumstances, and it intends to achieve the following aim upon solving the problems associated with the ordinary techniques. That is, the invention provides a resin composition having a high adhesion between a resin layer and a metallic layer and an excellent durability, a process for producing the same and an electrophotographic fixing member.

The invention provides a resin composition in which a metallic layer is provided on a surface of a resin layer having a porous structure at least on the surface.

Further, the invention provides an electrophotographic fixing member using the resin composition.

Still further, the invention provides a process for producing the resin composition, which includes the steps of providing the porous structure at least on the surface of the resin layer and forming the metallic layer on the surface of the resin layer.

BRIEF DESCRIPTION OF THE DRAWING

Preferred embodiments of the invention will be described in detail based on the following FIGURE, wherein.

DESCRIPTION OF THE PREFERRED EMBODIMENTS

Figure 1:
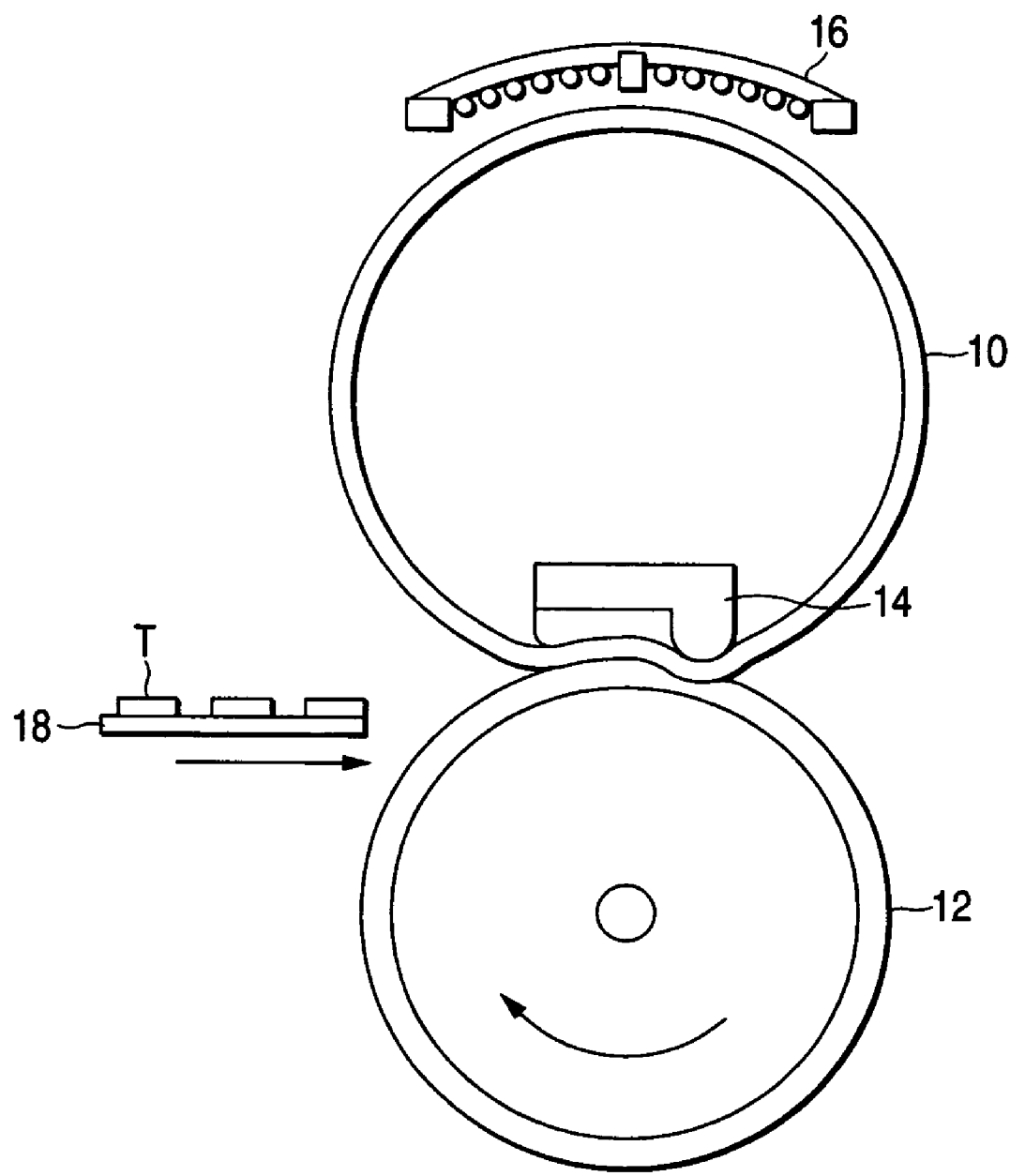
FIG. 1 is a schematic view showing an example of a fixing device having an electrophotographic fixing member of the invention.

The invention is described in detail below. Both the resin composition and the process for producing the same in the invention are explained.

The resin composition of the invention includes the metallic layer which is provided on the surface of the resin layer having the porous structure at least on the surface.

Many pores are present in the surface of this resin layer. Accordingly, when the metallic layer is formed on the surface of the resin layer having the pores, the metal is incorporated near the insides of the pores in the surface of the resin layer to be able to increase an adhesion (contact) area and obtain a so-called anchoring effect. For this reason, the resin composition of the invention has a high adhesion between the resin layer and the metallic layer and is excellent in durability.

The resin composition of the invention can be produced by forming the metallic layer on the surface of the resin layer having the porous structure at least on the surface (process for producing the resin composition in the invention). The details are described below along with a structure of each layer.

First, the resin layer is described.

In the resin layer, only a portion near the surface on which the metallic layer is formed may have a porous structure or the whole layer may have a porous structure. In view of a strength, it is preferable that only the portion near the surface has the porous structure.

In the porous structure, many fine continuous holes are present from the surface through the inside of the layer, and it is unnecessary that the holes are penetrated. The size of the pore (pore diameter) is, in view of obtaining the desired adhesion (contact) area and anchoring effect, preferably 0.01 μm or more and 100 μm or less, more preferably 0.05 μm or more and 10 μm or less, further preferably 0.1 μm or more and 5 μm or less. When the size of the pore is less than 0.01 μm, the desired anchoring effect might not be obtained. When it is more than 100 μm, the surface of the metallic layer itself might be too rough.

The size of the pore here refers to an average value of a pore diameter obtained by observing the surface of the resin layer with a scanning electron microscope and processing its image.

The material constituting the resin layer varies depending on a desired use. For example, when it is used in a fixing member to be described later, it is preferably a heat-resistant material. Examples of the heat-resistant material include a polyester, polyethylene phthalate, a polyether sulfone, a polyether ketone, a polysulfone, a polyimide, a polyimideamide and a polyamide. It is preferable to use materials classified as a polyimide, an aromatic polyamide (aramid) and a thermotropic liquid crystal polymer. The thermotropic liquid crystal polymer includes a wholly aromatic polyester, an aromatic-araliphatic polyester, an aromatic polyazomethine and an aromatic polyester carbonate. Of these, a polyimide is especially preferable because a heat resistance and an abrasion resistance are high. With the use of this polyimide, theresin composition can advantageously be applied to a fixing member requiring a heat resistance and an abrasion resistance. A thermosetting polyimide is preferable. In the thermosetting polyimide, an imide group is directly bound to an organic group in a molecular main chain, and this imide group serves as a recurring unit for polymerization. An organic group includes, for example, an aliphatic group and an aromatic group. An aromatic group such as a phenyl group, a naphthyl group or a diphenyl group (including a group in which two phenyl groups are bound through a methylene group or a carbonyl group) provides good mechanical properties at a high use temperature. A polyamic acid which is one polyimide precursor can be formed by polycondensing equivalent amounts of an organic acid dianhydride and an organic diamine in an organic polar solvent of room temperature.

The thickness of the resin layer can properly be selected depending on the use. When it is used in a fixing member, it is preferably from 50 to 150 μm. The respective resin layers may be formed of a single layer or plural layers. The respective layers may be made of the same material or different materials.

In the invention, a method for forming the resin layer is not particularly limited so long as at least the surface has a porous structure as stated above. For example, the following methods are preferable.

(a) The resin layer is formed by coating a polyimide precursor solution to form a polyimide precursor film (hereinafter referred to as a "PI precursor film forming step"), coating a solvent substitution rate control member having many through-holes on the surface of the polyimide precursor film, contacting the polyimide precursor film with a coagulation solvent to form a polyimide precursor film having a porous structure on the surface (hereinafter referred to as a "PI precursor precipitation step"), and subjecting the polyimide precursor film having the porous structure on the surface to hot imidation to form a polyimide resin layer having a porous structure on the surface (hereinafter referred to as a "PI resin layer forming step") (this method is hereinafter referred to as a method (a)).

(b) A resin layer is formed by forming a bulk resin layer using a resin material coating solution (hereinafter referred to as a "bulk resin layer forming step") and forming a porous resin layer on the surface of the bulk resin layer using a resin material coating solution containing a foaming agent (hereinafter referred to as a "porous resin layer forming step") (this method is referred to as a method (b)).

The method (a) is described below.

-PI Precursor Film Forming Step-

In the PI precursor film forming step, the polyimide precursor film is usually formed by coating the polyimide precursor solution on the surface of the substrate. The polyimide precursor used in the solution includes a polyamic acid obtained from a diamino compound and a tetracarboxylic dianhydride. Examples of the solvent that dissolves the polyimide precursor include aprotic polar solvents such as N-methylpyrrolidone, N,N-dimethylacetamide, acetamide and N,N-dimethylformanmide.

The polyimide precursor solution may contain, according to the purpose, a lubricant, a plasticizer, conductive particles, an antioxidant and other additives.

The polyimide precursor-containing solution can be obtained by, for example, reacting an aromatic tetracarboxylic dianhydride with an aromatic diamine component in an organic polar solvent to form a polyimide precursor.

Typical examples of the aromatic tetracarboxylic acid include pyromellitic dianhydride, 3,3',4,4'-biphenyltetracarboxylic dianhydride, 3,3',4,4'-benzophenonetetracarboxylic dianhydride, 2,3,4,4'-biphenyltetracarboxylic dianhydride, 2,3,6,7-naphthalenetetracarboxylic dianhydride, 1,2,5,6-naphthalenetetracarboxylic dianhydride, 2,2-bis(3,4-dicarboxyphenyl)ether dianhydride, tetracarboxylic esters thereof, and mixtures of the tetracarboxylic acids.

The aromatic diamine component is not particularly limited. Examples thereof include p-phenylenediamine, m-phenylenediamine, 4,4'-diaminodiphenyl ether, 4,4'-diaminophenylmethane, benzidine, 3,3'-dimethoxybenzidine, 4,4'-diaminodiphenylpropane and 2,2-bis[4-(4-aminophenoxy)phenyl]propane.

The amount of the polyimide precursor solution coated on the substrate varies with a desired film thickness. It is preferably from 200 to 1,800 $g/m^2$. When it is less than 200 $g/cm^2$, the film thickness might be insufficient. When it exceeds 1,800 $g/m^2$, the film thickness might be excessive.

A method for coating a polyimide precursor solution is not particularly limited. Examples thereof include a centrifugal forming coating method described in JP-A-57-74131, an inner surface coating method described in JP-A-62-19437, an outer surface coating method described in JP-A-6-23770, a dip coating method described in JP-A-3-180309 and a spiral coating method described in JP-A-9-85756. When a columnar or cylindrical substrate is used, it is preferable to use a dip coating method described in JP-A-2002-91027.

The dip coating method is characterized in that a productivity is high. In a usual method, a coating film thickness is controlled with a viscosity of a coating solution and a withdrawal rate. The polyimide precursor solution is problematic in that a viscosity is quite high at a low concentration. Accordingly, a wet thickness of a film after coating is too high, so that the coating solution can hardly be coated to a desired film thickness. For this reason, it is especially preferable to apply a dip coating method described in JP-A-2002-91027 in which a float having a predetermined circular hole is put on a coating solution, and a substrate is withdrawn through the circular hole. It is advisable that a size (diameter) of the circular hole of the float in the dip coating method is properly adjusted by a desired film thickness. A thickness of a wet film to be coated is controlled by a space between the circular hole and the substrate, and a dry film thickness is a product of a wet film thickness and a concentration of a coating solution. The space is preferably from 1 to 3 times a desired wet film thickness. This is because a dry film thickness is not necessarily proportional to a wet film thickness because of a viscosity and/or a surface tension of a coating solution and shrinkage in curing.

-PI Precursor Precipitation Step-

In the PI precursor precipitation step, the solvent substitution rate control member having many through-holes is coated on the surface of the polyimide precursor film when contacting the polyimide precursor film with the coagulation solvent. The coagulation solvent is a solvent which is insoluble in the polyimide precursor but compatible with the solvent (aprotic polar solvent) of the polyimide precursor solution. Accordingly, when the polyimide precursor film is contacted with the coagulation solvent, the solvent (aprotic polar solvent) is eluted into the coagulation solvent from the polyimide precursor film and the coagulation solvent is permeated therein instead. Since the polyimide precursor is insoluble in the coagulation solvent, this polyimide precursor is precipitated. When the polyimide precursor film is contacted with the coagulation solvent, the solvent substitution rate control member is coated on the surface of the polyimide precursor film, whereby the coagulation solvent is contacted with the polyimide precursor film via only the through-holes of the control member. Only in this contacted portion, the solvent (aprotic polar solvent) is eluted into the coagulation solvent, and the coagulation solvent is permeated instead. In the polyimide precursor film, the pores are formed only in portions of the through-holes of the control member. Thus, the polyimide precursor film having the porous structure on the surface can be formed. After the polyimide precursor film having the porous structure on the surface is formed, the solvent substitution rate control member is separated.

The structure of the solvent substitution rate control member is not particularly limited so long as it is coated on the surface of the polyimide precursor film. Generally, a sheet is used. Specifically, for example, a nonwoven fabric or a porous film made of a polyolefin such as polyethylene or polypropylene, cellulose or polyethylene fluoride fibers (for example, Teflon (R)) is proposed. The solvent substitution rate control member has many through-holes. The number or the size thereof varies with a desired porous structure. It is advisable that the size (diameter) of the through-holes is determined to be larger than the size of the pore of the porous structure in the desired polyimide resin layer.

Examples of the coagulation solvent include water, alcohols (such as methanol and ethanol), hydrocarbons (such as hexane and heptane), ketones (such as acetone and butanone) and esters (such as ethyl acetate). Water is preferable because it is easiest to handle.

With respect to a method in which the polyimide precursor film is contacted with the coagulation solvent, a method in which a substrate with the polyimide precursor film formed thereinside is dipped in a bath filled with the coagulation solvent is preferable. In this method, the polyimide precursor film can uniformly be contacted with the coagulation solvent. In this dipping method, in view of precipitating the polyimide precursor at good efficiency to form the porous structure, it is advisable that the coagulation solvent is stirred to expedite its permeation into the through-holes in the solvent substitution rate control member.

In the method in which the polyimide precursor film is contacted with the coagulation solvent, the coagulation solvent may flow down or be sprayed on the polyimide precursor film.

In the PI precursor precipitation step, the amount of the aprotic polar solvent eluted from the polyimide precursor film varies with a time for contacting the polyimide precursor film with the coagulation solvent. That is, the size or the depth (length) of the pore in the porous structure can properly be controlled with this time.

Usually, the amount of the aprotic polar solvent eluted from the polyimide precursor film to the coagulation solvent is increased with the increase in the temperature of the coagulation solvent. Thus, the size or the depth of the pore in the porous structure can properly be controlled also with the temperature.

It is also possible that the amount of the aprotic polar solvent eluted from the polyimide precursor film can also be controlled by previously mixing the coagulation solvent with the aprotic polar solvent, whereby the size or the depth of the pore in the porous structure can properly be controlled.

-PI Resin Layer Forming Step-

In the PI resin layer forming step, it is advisable that drying is first conducted for removing the aprotic polar solvent. Preferable drying conditions are that a temperature is from 20 to 120° C. and a time is from 10 to 60 minutes. It is also effective that hot air is fed to the inside of the cylinder. The drying temperature may be increased stepwise or at a fixed rate.

When the drying is conducted by making a longitudinal direction of the substrate vertical, streak or unevenness might occur in a part of a film. In this case, it is effective that rotation is further conducted by making the longitudinal direction of the substrate vertical. The rotational speed is preferably from 10 to 100 rpm. In some rotating device, the rotational speed may be higher or lower than this range. A device which conducts rotation by making the longitudinal direction of the substrate vertical is simpler in structure than a device which conducts rotation by making the longitudinal direction of the cylinder lateral.

In the PI resin layer forming step, after the drying, the polyimide precursor film is heated preferably at a temperature of approximately 350° C. (more preferably from 300 to 450° C.) for 20 to 60 minutes for hot imidation to be able to form a polyimide resin layer. When the solvent remains in the hot imidation, the polyimide resin layer might be swelled. Thus, it is advisable to completely remove the residual solvent before the hot imidation. Specifically, it is preferable that before the hot imidation the film is heat-dried at a temperature of from 200 to 250° C. for from 10 to 30 minutes and the temperature is then increased stepwise or at a fixed rate for hot imidation.

By this method, the polyimide, resin layer having the porous structure on the surface can be formed.

The method (b) is described below. The method (b) is described according to the method in which the polyimide resin layer is formed using the polyimide precursor solution, which is however not critical.

-Bulk Resin Layer Forming Step-

In the bulk resin layer forming step, the bulk resin layer (polyimide resin layer) can be formed as in the method (a) except that the solvent substitution rate control member is not used in the PI precipitation step. The "bulk" here is a word by which to distinguish the layer from the resin layer having the porous structure, and the bulk resin layer means a resin layer free from the porous structure. The PI precipitation step may be dispensed with as required.

-Porous Resin Layer Forming Step-

In the porous resin layer forming step, the bulk resin layer (polyimide resin layer) can be formed as in the method (a) except that a foaming agent is added to the polyimide precursor solution and the solvent substitution rate control member is not used in the polyimide precipitation step. In this manner, the porous resin layer can easily be formed by subjecting the resin material (polyimide precursor) to heat-curing treatment (hot imidation) with the foaming agent. The PI precipitation step may be dispensed with as required.

Specific examples of the foaming agent include "Cell Mike C191" (made by Sankyo Kasei K.K., main component azodicarbonamide) and "Cell Mike 417" (made by Sankyo Kasei K.K., inorganic type).

When the resin layer is formed of plural layers as in the method (b), it is advisable that a lower resin layer is dried or half-cured and completely heat-cured (hot imidation) with heat-curing (hot imidation) of an upper resin layer. This method is preferable because the respective layers are melt-adhered to provide an excellent adhesion strength.

As in the methods (a) and (b), the resin material solution (polyimide precursor solution) is usually coated when the resin layer is formed on the surface of the substrate. The substrate is properly selected according to the use form of the resin composition. For example, when the resin composition is used in the form of a film, a plate is used as a substrate. When it is used in the form of a belt, a columnar, cylindrical, elliptical columnar or elliptical cylindrical belt is used. As the material of the substrate, a metal such as aluminum, copper or stainless steel is preferable. At this time, it is also effective that the surface is plated with chromium or nickel or coated with a fluororesin or a silicone resin or a release agent is coated on the surface to prevent a polyimide resin from adhering to the surface. Since the resin composition can also be used without removing the substrate, the form or the material of the substrate can properly be selected according to the use form of the resin composition.

The metallic layer is described below.

It is advisable that the metallic layer is made of copper, nickel, chromium, cobalt, iron, gold, silver, tin, zinc, aluminum or an alloy thereof according to the use. It may be formed of a single layer or plural layers. When it is formed of plural layers, the respective layers may be made of the same metal or different metals.

The metallic layer can preferably be formed by, for example, chemical plating (such as electroplating or electroless plating) or physical plating (such as vacuum deposition, sputtering or ion plating). These platings are particularly preferable because a metallic film (layer) is grown from inside the pore in the surface of the resin layer to be able to make an adhesion strength quite high. As the metallic layer formed by these platings, for example, a structure in which an electroless plated layer and an electroplated layer are formed in this order is preferable. Especially when it is used in a fixing member and an electromagnetic induction heat generation system is employed as a heat source, the presence of the copper-containing metallic layer is preferable because the heat efficiency is so high as to reduce the film thickness. Specifically, as the thus-formed metallic layer, a structure in which an electroless plated nickel layer or an electroless plated copper layer and an electroplated copper layer are formed in this order is preferable.

When, for example, an electroless plated metallic layer is formed in the metallic layer, it can be formed by reductively depositing a metallic ion with a reducing agent such as formalin through electroless plating. When a metal is copper, a method described in JP-A-4-72070 or JP-A-4-186891 can preferably be employed. The thickness of the metallic layer formed by electroless plating is preferably from 0.1 to 1 µm, more preferably from 0.1 to 0.5 µm. When an electroplated metallic layer is formed, it is preferable that an electroless plated metallic layer is previously formed. Although the electroless plated metallic layer has generally a high resistance, it is provided when a current has to be passed through the metallic layer. Thus, the electroless plated metallic layer serves as an electrode, and electroplating is conducted by a general method, whereby the electroplated metallic layer can be formed. The thickness of the electroplated layer is not absolutely defined because it varies with the metal used or the usage. For example, when the electroplated layer is used in a flexible circuit substrate and formed of copper, the thickness is preferably from 5 to 50 µm. When the electroplated layer is used in a fixing member and formed of copper, the thickness is preferably from 3 to 20 µm. In case of nickel, it is preferably from 8 to 60 µm. In case of iron, it is preferably from 10 to 100 µm.

It is preferable that the thickness of the metallic layer is 10 µm or less. For example, when the resin layer is a polyimide resin layer, the polyimide precursor resin layer is heat-cured to form the polyimide resin layer. Accordingly, the film is shrunk by approximately 10% (layer thickness). When the thickness exceeds 10 µm, wrinkling might occur. For this reason, the thickness of 10 µm or less little poses the problem of wrinkling.

It is advisable that the metallic layer is formed while rotating the substrate lest the film thickness becomes uneven. Further, it is advisable that the electrode in the electroplating is adapted to surround the whole resin layer.

The form of the resin composition in the invention is properly selected depending on the usage. When it is used in a circuit substrate, a film is preferable. When it is used in a fixing member, a belt is preferable. It is also possible that the resin composition is formed on a cylindrical or columnar substrate and used as such in a fixing roller.

When the resin composition of the invention is used in a fixing member, an elastic layer and/or a release layer is further provided, as required, on the surface of the metallic layer. These layers can improve an image quality in fixing a color and prevent offset. Since the elastic layer and the release, layer are used in a fixing member, they are preferably formed of a heat-resistant material.

As the elastic layer, an elastic layer containing a fluororubber as a main component and mixed with fluororesin particles or inorganic particles of SiC or $Al_2O_3$ as required is proposed. Examples of the fluororubber include fluorine-containing elastomers such as a copolymer of vinylidene fluoride (VdF)

as a main component and hexafluoropropylene (HFP), a three-component copolymer of the VdF-HFP copolymer and tetrafluoroethylene (TFE), and an alternating copolymer of TFE and propylene. Further, a VdF-chlorotrifluoroethylene copolymer and a mixture of a silicone rubber or a fluorosilicone rubber and the fluorine-containing elastomer containing VdF as a main component are also available.

With respect to the release layer, fluororesins such as polytetrafluoroethylene (PTFE), a tetrafluoroethylene-perfluoroalkylvinyl ether copolymer (PFA) and a tetrafluoroethylene-hexafluoropropylene copolymer (FEP) are preferable. For improving a durability and electrostatic offset, a carbon powder may be dispersed in the release layer. The thickness of the release layer is preferably from 4 to 40 μm.

The fluororesin film as the release layer is preferably formed by a method in which its aqueous dispersion is coated on the surface of the lower layer and baked. When the adhesion of the fluororesin film is poor, there is a method in which a primer layer is previously formed on the surface of the lower layer by coating as required. Examples of the material of the primer layer include polyphenylene sulfide, a polyether sulfone, a polysulfone, a polyamideimide, a polyimide and derivatives thereof. Further, it is preferable to contain at least one compound selected from fluororesins. The thickness of the primer layer is preferably from 0.5 to 10 μm.

The resin composition of the invention can advantageously be used in an electrophotographic fixing member (electrophotographic fixing member of the invention). A fixing device having the same is a fixing device of an electromagnetic induction heat generation system, and it can have a known structure. In the fixing device of the electromagnetic induction heat generation system, an alternating current is passed through an electromagnetic induction coil, whereby a magnetic flux penetrating through the metallic layer of the fixing member (resin composition of the invention) is generated and an excess current is generated in the metallic layer to allow heat generation and heat-fix a toner image at good efficiency. Thus, in the fixing device of the electromagnetic induction heat generation system, the fixing member is repeatedly heated with the excess current. The satisfactory durability against delamination can be imparted by using, as a fixing member, the resin composition of the invention having the excellent adhesion between the resin layer and the metallic layer. Especially in case of the belt, delamination tends to occur due to a resistance to sliding of a pressure roller and a nip portion. Accordingly, it is effective to use the resin composition of the invention as the fixing member. An image forming apparatus having such a fixing device can also have a known structure.

Further, it can be applied as a transfer-fixing member which is one of fixing members. This transfer-fixing member is also called an intermediate transfer member. A toner image is once transferred onto the intermediate transfer member, the toner is heat-melted on the intermediate transfer member, and the toner image is heat-pressed on a recording medium. Thus, the transfer-fixing member conducts the transfer and the fixing simultaneously. An image forming apparatus having such a transfer-fixing member can have itself a known structure.

An example of a fixing device having the electrophotographic fixing member of the invention (resin composition of the invention) is described below. However, this is not critical.

A fixing device shown in FIG. 1 has a heat-fixing belt member (fixing member of the invention) 10 having a metallic layer, and a pressure roller 12. The heat-fixing belt member 10 is urged against the surface of the pressure roller 12 through a pressing member 14 to form a nip portion. The pressure roller 12 is provided with a driving unit (not shown). An electromagnetic induction coil 16 is mounted around the surface of the heat-fixing belt member 10.

In the fixing device shown in FIG. 1, the pressure roller 12 is rotated with the driving unit (not shown), and the heat-fixing belt member 10 is also rotated consequently. When an alternating current is passed through the electromagnetic induction coil 16, a magnetic flux penetrating through the metallic layer is generated in the heat-fixing belt member 10, and an excess current is generated in the metallic layer for heat generation. When a recording medium 18 with an unfixed toner image T recorded is passed through a nip portion between the heat-generated heat-fixing belt member 10 and the pressure roller 12, the toner is heat-melted by the heat generation of the heat-fixing belt member 10 to conduct the fixing.

EXAMPLES

The invention is illustrated more specifically by referring to Examples and Comparative Examples. However, the invention is not limited to these Examples.

Example 1

An N,N-dimethylacetamide solution of a polyamic acid as a polyimide precursor (trade name: U Varnish, made by Ube Industries, Ltd., polyimide precursor solution) is used. A solid content is adjusted to 20%, and a viscosity to approximately 1 Pa·s respectively.

A glass plate having a thickness of 0.2 mm and a size of 20×150 mm is used as a substrate, and dipped in the polyimide precursor solution by making the longitudinal direction vertical. Then, the plate is withdrawn at a rate of 100 mm/min to form a polyimide precursor film.

Subsequently, a solvent substitution rate control member (U Pore UP2015, gas permeability 550 sec/100 cc: made by Ube Industries, Ltd.) having many through-holes is coated on the surface of the polyimide precursor film, dipped in water, and allowed to stand for 1 minute. When the substrate is withdrawn, the surface of the polyimide precursor film has a porous structure with many pores.

Waterdrops are wiped out from the surface, and the substrate is then put into a drying oven. The temperature is adapted to be gradually increased such that the initial temperature is 30° C. and 1 hour later, reaches 100° C. After the drying, the film becomes transparent. The substrate is further heat-dried at 150° C. for 20 minutes and at 200° C. for 20 minutes to completely remove N,N-dimethylacetamide and water.

Thereafter, the heating is conducted at 350° C. for 30 minutes for hot imidation. As a result, a polyimide resin layer having a porous structure on the surface is formed on the whole surface of the substrate. The film thickness of the polyimide resin layer is 0.5 μm and nearly uniform. The size of the pore in the porous structure is 0.8 μm.

Subsequently, electroless copper plating is applied to the surface of the polyimide resin layer to a thickness of 0.3 μm.
-Composition of an Electroless Plating Bath-
$CuSO_4 \cdot 5H_2O$: 10 g/liter
EDTA·2Na: 30 g/liter
HCHO (37 mass %) solution: 5 g/liter
PEG#1000: 0.5 g/liter
-Electroless Plating Conditions-
Plating bath temperature: 65° C.
Stirring method: air stirring
Plating time: 8 minutes
pH of a plating bath: 12.5

After the electroless plated metallic layer is formed by the electroless plating as described above, copper is electroplated on the electroless plated metallic layer to a thickness of 10 μm under the following conditions to obtain an electroplated metallic layer.

-Composition of an Electroplating Bath-
$CuSO_4.5H_2O$: 120 g/liter
$H_2SO_4$: 150 g/liter
-Electroplating Conditions-
Plating bath temperature: 25° C.
Stirring method: air stirring
Plating condition: 2 A/dm$^2$
Plating time: 30 minutes In this manner, the metallic layer including the electroless plated copper layer and the electroplated copper layer is formed. Further, a heat-resistant primer (Teflon primer "855-021", made by du Pont, aqueous paint) is coated on the metallic layer, and a PFA dispersion ("500CL", made by du Pont, aqueous paint) is then coated thereon. Calcination is conducted at 380° C. to form a release layer.

The thus-obtained film of the resin composition is processed into a belt to provide a heat-fixing belt. The resulting heat-fixing belt is installed on a fixing device shown in FIG. 1 as the heat-fixing belt member 10, and an idling test is performed at 170° C. for 6 hours. Consequently, delamination does not occur in an interface between the polyimide resin layer and the metallic layer (heat generation layer).

The pressure roller 12 of the fixing device shown in FIG. 1 is produced as follows.

-Production of a Pressure Roller-

A fluororesin tube having an adhesion primer coated thereinside and having an outer diameter of 50 mm, a length of 340 mm and a thickness of 30 μm and a metallic hollow core are set in a mold. A liquid foam silicone rubber is injected between the fluororesin tube and the core to a layer thickness of 2 mm. The silicone rubber is vulcanized and foamed by heat treatment at 150° C. for 2 hours to provide a rubber elasticity. In this manner, the pressure roller is produced.

Example 2

A fixing belt is produced as in Example 1 except that a polyimide resin layer having a porous structure on the surface and having a thickness of 20 μm is formed by properly changing a viscosity of a polyimide precursor solution and a withdrawal rate of a substrate. When this fixing belt is evaluated as in Example 1, delamination does not occur in an interface between the polyimide resin layer and the metallic layer (heat generation layer).

Example 3

A fixing belt is produced as in Example 1 except that a polyimide resin layer having a porous structure on the surface and having a thickness of 50 μm is formed by properly changing a viscosity of a polyimide precursor solution and a withdrawal rate of a substrate, and an elastic layer [obtained by coating and drying a silane coupling agent "KBE 903" (made by Shin-etsu Chemical Industry Co., Ltd.) and then coating and drying a liquid silicone rubber "KE1334" (made by Shin-etsu Chemical Industry Co., Ltd.): hardness 40° (JIS-A)] and a release layer (same as in Example 1) are further formed on a metallic layer in this order. When this fixing belt is evaluated as in Example 1, delamination does not occur in an interface between the polyimide resin layer and the metallic layer (heat generation layer).

Example 4

A fixing belt is produced as in Example 1 except that a polyimide resin layer having a porous structure on the surface and having a thickness of 1.0 μm is formed into an endless belt by properly changing a viscosity of a polyimide precursor solution and a withdrawal rate of a substrate and using a cylindrical substrate. When the fixing belt is evaluated as in Example 1, delamination does not occur in an interface between the polyimide resin layer and the metallic layer (heat generation layer).

Example 5

A fixing belt is produced as in Example 1 except that a polyimide resin layer having a porous structure on the surface and having a thickness of 20 μm is formed into an endless belt by properly changing a viscosity of a polyimide precursor solution and a withdrawal rate of a substrate and using a cylindrical substrate. When the fixing belt is evaluated as in Example 1, delamination does not occur in an interface between the polyimnide resin layer and the metallic layer (heat generation layer).

Example 6

A fixing belt is produced as in Example 1 except that a polyimide resin layer having a porous structure on the surface and having a thickness of 20 μm is formed into an endless belt by properly changing a viscosity of a polyimide precursor solution and a withdrawal rate of a substrate and using a cylindrical substrate, and an elastic layer [obtained by coating and drying a silane coupling agent "KBE 903" (made by Shin-etsu Chemical Industry Co., Ltd.) and then coating and drying a liquid silicone rubber "KE1334" (made by Shin-etsu Chemical Industry Co., Ltd.): hardness 40° (JIS-A)] and a release layer (same as in Example 1) are further formed on a metallic layer in this order. When the fixing belt is evaluated as in Example 1, delamination does not occur in an interface between the polyimide resin layer and the metallic layer (heat generation layer).

Example 7

A fixing belt is produced as in Example 1 except that a polyimide resin layer is formed by the following method. When the fixing belt is evaluated as in Example 1, no delamination occurs in an interface between the polyimide resin layer and the metallic layer (heat generation layer).

-Formation of a Polyimide Resin Layer-

A polyimide precursor film is first formed as in Example 1 except that a solvent substitution rate control member having many through-holes is not coated on the polyimide precursor film, and this film is half-cured at 100° C. (bulk polyimide resin layer).

Subsequently, a polyimide precursor film is formed on the surface of the half-cured bulk polyimide resin layer as in Example 1 except that a foaming agent ("Cell Mike C-191", made by Sankyo Kasei K.K.) is added to a polyimide precursor solution and a solvent substitution rate control member having many through-holes is not coated on the polyimide precursor film. Hot imidation is conducted, and the bulk polyimide resin layer and the porous polyimide resin layer are laminated in this order. Thus, the polyimide resin layer having the porous structure on the surface is formed. The film thickness of the polyimide resin layer is 50 μm and nearly uniform (bulk polyimide resin layer 40 μm, porous polyimide resin layer 10 μm). Further, the size of the pore in the porous structure is 3.0 μm.

Example 8

A fixing belt is produced as in Example 1 except that an electroless plated nickel layer is formed instead of the electroless-plated copper layer in the metallic layer under the following conditions. When the fixing member is evaluated as in Example 1, delamination does not occur in an interface between the polyimide resin layer and the metallic layer (heat generation layer)
-Composition of an Electroless Plating Bath-
$CuSO_4.5H_2O$: 20 g/liter
$NH_3.H_2O$: 5 g/liter
HCHO: 10 g/liter
-Electroless Plating Conditions-
Plating bath temperature: 30° C.
Stirring method: air stirring
Plating time: 5 minutes
pH of a plating bath: 10.0

Comparative Example 1

A fixing belt is produced as in Example 1 except that a bulk polyimide resin layer is formed without coating a solvent substitution rate control member having many through-holes on a polyimide precursor film. When the fixing belt is evaluated as in Example 1, delamination occurs in an interface between the polyimide resin layer and the metallic layer (heat generation layer) after 2 hours.

Comparative Example 2

A fixing belt is produced as in Example 4 except that a bulk polyimide resin layer is formed without coating a solvent substitution rate control member having many through-holes on a polyimide precursor film. When the fixing belt is evaluated as in Example 1, delamination occurs in an interface between the polyimide resin layer and the metallic layer (heat generation layer) after 2.5 hours.

From Examples, it is found that in the resin composition of the invention in which the metallic layer is provided on the polyimide resin layer having the porous structure on the surface, the polyimide resin layer and the metallic layer can be adhered mechanically firmly and the fixing belt using this composition does not cause the delamination due to the repeated electromagnetic induction heat generation or the resistance to sliding of the pressure roller and the nip portion and has the excellent durability.

Thus, the invention provides the resin composition having the high adhesion between the resin layer and the metallic layer and the excellent durability, the process for producing the same, and the electrophotographic fixing member.

The entire disclosure of Japanese Patent Application No. 2001-282980 filed on Sep. 18, 2001 including specification, claims, drawings and abstract is incorporated herein by reference in its entirety.

What is claimed is:

1. A process for producing a resin composition comprising a metallic layer provided on an outer surface of a resin layer having a porous structure on the outer surface, the process comprising:
    providing the porous structure on the outer surface of the resin layer wherein only a portion of the resin layer at or near the outer surface has the porous structure; and
    forming the metallic layer on the outer surface of the resin layer.

2. The process for producing the resin composition as claimed in claim 1, wherein the resin layer is formed by coating a polyimide precursor solution to form a polyimide precursor film, coating a solvent substitution rate control member having many through-holes on the outer surface of the polyimide precursor film, contacting the polyimide precursor film with a coagulation solvent to form a polyimide precursor film having a porous structure on the outer surface, and subjecting the polyimide precursor film having the porous structure on the outer surface to hot imidation to form a polyimide resin layer having a porous structure on the outer surface.

3. The process for producing the resin composition as claimed in claim 1, wherein the metallic layer is formed by chemical plating or physical plating.

4. The process of claimed in claim 1, wherein said resin composition is in the form of a belt.

5. The process as claimed in claim 1, further comprising forming at least one of an elastic layer and a release layer over the metallic layer.

6. The process as claimed in claim 1, wherein said metallic layer is formed by plating.

7. The process as claimed in claim 1, wherein the resin layer has a thickness of from 50 μm to 150 μm.

8. The process as claimed in claim 1, wherein the porous structure has an average pore size of from 0.01 μm to 100 μm.

9. The process as claimed in claim 1, wherein forming the metallic layer comprises forming an electroless plated layer on the outer surface of the resin layer and then forming an electroplated layer on the electroless plated layer.

10. The process as claimed in claim 1, wherein the resin composition is in the form of a film.

11. A process for producing a resin composition comprising a metallic layer provided on an outer surface of a resin layer having a porous structure on the outer surface, the process comprising:
    providing the porous structure at least on the outer surface of the resin layer wherein only a portion of the resin layer at or near the outer surface has the porous structure and wherein the resin layer is formed by forming a bulk resin layer using a resin material coating solution and forming a porous resin layer on the outer surface of the bulk resin layer using a resin material coating solution containing a foaming agent; and
    forming the metallic layer on the outer surface of the resin layer.

12. The process for producing the resin composition as claimed in claim 11, wherein a layer containing a polyimide resin as a main component is formed as the resin layer.

* * * * *